United States Patent
Baranwal

(10) Patent No.: US 8,519,877 B1
(45) Date of Patent: Aug. 27, 2013

(54) LOW NOISE AND LOW POWER ARRANGEMENT FOR PLAYING AUDIO SIGNALS

(75) Inventor: Shailendra Kumar Baranwal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/432,195

(22) Filed: Mar. 28, 2012

(51) Int. Cl.
  *H03M 1/66* (2006.01)

(52) U.S. Cl.
  USPC ........... 341/144; 375/216; 375/219; 375/220; 375/316; 327/103; 327/554; 330/251; 330/281; 330/282; 330/284; 341/140; 341/147; 341/152; 341/159

(58) Field of Classification Search
  USPC .................. 341/140–165; 375/216, 219, 220, 375/316; 327/103, 554; 330/251, 281, 282, 330/284
  See application file for complete search history.

(56) References Cited

U.S. PATENT DOCUMENTS

| | | | | |
|---|---|---|---|---|
| 5,939,991 A * | 8/1999 | Deng | ........................... | 340/638 |
| 7,088,789 B2 * | 8/2006 | Cheng et al. | ................. | 375/316 |
| 7,227,481 B2 * | 6/2007 | del Mar Chamarro Marti et al. | ............................. | 341/143 |
| 7,248,192 B2 * | 7/2007 | Gillespie et al. | ............. | 341/118 |
| 7,369,078 B2 * | 5/2008 | Nickel et al. | ................... | 341/155 |
| 7,430,235 B2 * | 9/2008 | Cheng et al. | .................. | 375/216 |
| 7,528,760 B2 * | 5/2009 | Forejt | ............................ | 341/166 |
| 7,804,432 B2 * | 9/2010 | Fukuzawa et al. | ............ | 341/118 |
| 7,808,412 B2 * | 10/2010 | Fukuzawa et al. | ............ | 341/139 |
| 7,956,782 B2 * | 6/2011 | Werking | ........................ | 341/143 |
| 8,013,768 B2 * | 9/2011 | Jantzi et al. | .................... | 341/144 |
| 8,334,721 B2 * | 12/2012 | Jantzi et al. | ..................... | 330/51 |
| 2011/0221620 A1 | 9/2011 | Mahajan et al. | | |

* cited by examiner

*Primary Examiner* — Lam T Mai
(74) *Attorney, Agent, or Firm* — Alan A. R. Cooper; Wade J. Brady, III; Frederick J. Telecky, Jr.

(57) ABSTRACT

A circuit for providing audio signals to a load such as a speaker is provided that uses the speaker or headphone amplifier structure as a current to voltage converter, thereby eliminating a separate current to voltage converter from the circuit. Such a design removes one of the elements that creates noise in the circuit architecture and improves the dynamic range for the audio signal. For example, the output of a digital to analog converter is a single ended output provided to the speaker or headphone amplifier. The digital to analog converter can include a series of current sources that are summed up to provide the single ended output. Where the current sources have positive and negative current source mismatch, a feedback mechanism is employed to correct for the mismatch and reduce introduction of harmonic noise into the signal through the digital to analog converter.

15 Claims, 5 Drawing Sheets

LOW NOISE AND LOW POWER ARRANGEMENT FOR PLAYING AUDIO SIGNALS

TECHNICAL FIELD

This invention relates generally to circuits for providing analog information to a load, and more specifically, for providing a low power and low noise circuit for providing audio input to a load.

BACKGROUND

Various circuits are known for providing information from a digital source to an analog output such as a speaker. For example, common consumer applications such as portable music or communication devices provide digital data for conversion to an analog output such as a speaker or headphones. A goal for such devices is to reduce the amount of power used in driving its playback circuit such that there can be an increase in the playback time for the device. For certain audio playback devices, the audio quality relies on the dynamic range at negative 60 decibels power output. Various elements of the playback circuits, however, can create noise that necessitates consuming more power to overcome the noise introduced by those circuit elements.

FIG. 1 depicts one such known architecture for a circuit that provides an audio signal to a headphone for playback for a listener. In this architecture, an over-sampled sigma delta modulator 105 receives an audio signal from an UP-sampler circuit 110. The output of the over-sampled sigma delta modulator 105 is provided to a current steering digital to analog converter 115. The digital to analog converter 115 provides two outputs that are received by a current to voltage converter 120. The current to voltage converter includes multiple elements such as two resistors R1 and R2 and an amplifier A1. The output of this circuit is provided to a headphone amplifier 125. The headphone amplifier 125 includes multiple resistors R3, R4, R5, and R6 and a further amplifier. The output of the headphone amplifier 125 is provided to the headphone speakers that, in turn, produce the audible signal for the listener. In this circuit, the noise for the audio signal is created primarily by the current steering digital to analog converter 115, the current to voltage converter 120, and the headphone amplifier 125. The noise provided by the circuit elements results in a minimum power needed to drive the audio signal to have a sufficient audio quality above the background noise created by the circuit elements. Moreover, the noise created by the circuit elements negatively affects the dynamic range of the audio signal thereby reducing the audio quality experienced by the listener.

SUMMARY

Generally speaking and pursuant to these various embodiments, a circuit for providing audio signals to a load such as a speaker is provided that uses the speaker or headphone amplifier structure as a current to voltage converter, thereby eliminating a separate current to voltage converter from the circuit. Such a design removes one of the elements that creates noise in the circuit architecture and improves the dynamic range for the audio signal.

In one such example, the output of a digital to analog converter of the audio signal may be a single ended output provided to the speaker or headphone amplifier. An example of such a digital to analog converter can include a series of current sources that are summed up to provide the single ended output to the speaker or headphone amplifier. In the case where the current sources have positive and negative current source mismatch, a feedback mechanism can be employed to correct for the mismatch and reduce introduction of harmonic noise into the signal through the digital to analog converter. So configured, noise introduced by a current to voltage converter in previous known circuits is eliminated. Implementation of new circuits such as those described herein improve the dynamic range of the audio signal and reduces noise, thereby improving audio quality and extending the battery life of devices implementing such a design. These and other benefits may become clear upon making a thorough review and study of the following detailed description.

BRIEF DESCRIPTION OF THE DRAWINGS

The above needs are at least partially met through the provision of the low noise and low power arrangement for playing audio signals described in the following detailed description, particularly when studied in conjunction with the following drawings wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
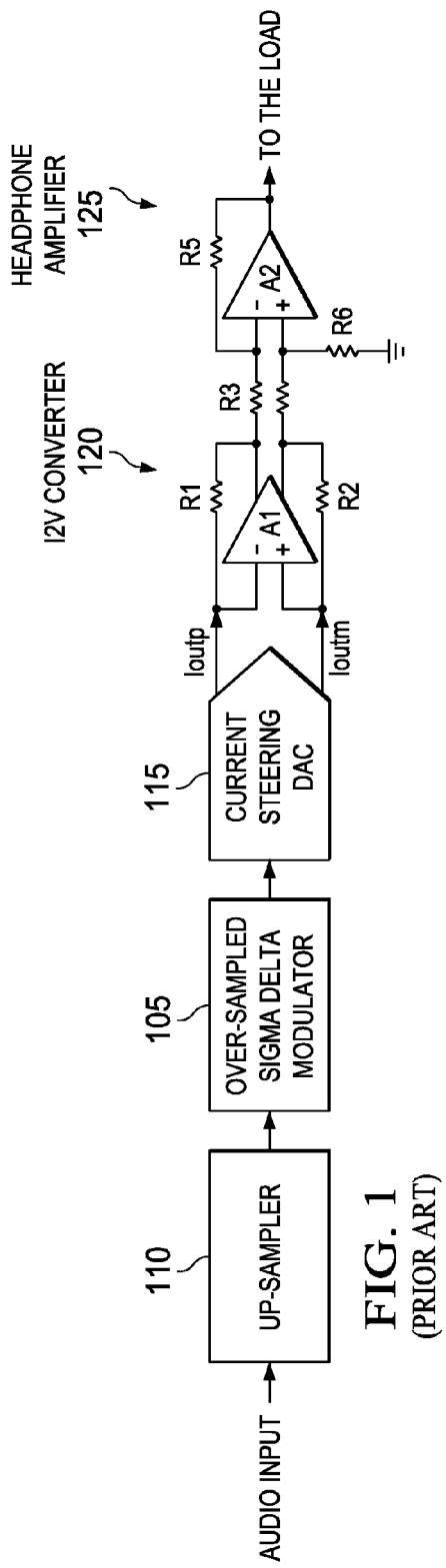
FIG. 1 comprises an example prior art circuit scheme as configured in accordance with various previously known circuit designs.
Figure 2:
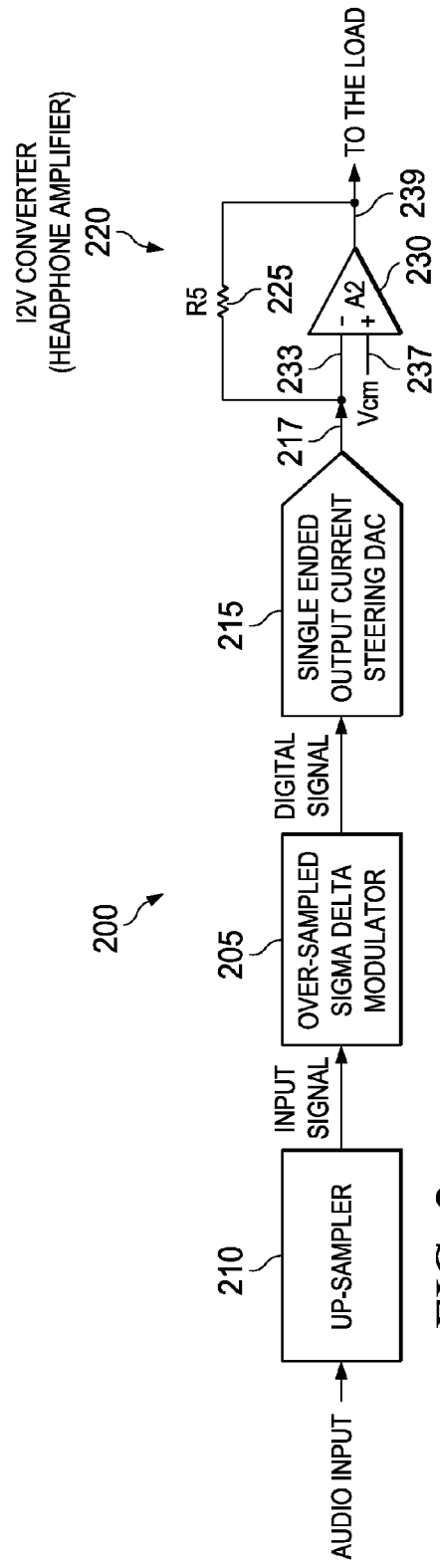
FIG. 2 comprises an example circuit scheme as configured in accordance with various embodiments of the invention.

Referring now to the drawings, and in particular, to FIG. 2, an illustrative circuit architecture that is compatible with many of these teachings will now be presented. The example apparatus 200 of FIG. 2 includes a modulator 205 configured to receive an input signal and to output a digital signal that is a modulated form of the input signal. A digital to analog converter 215 is configured to receive the digital signal, by one example audio data, and provide a single ended analog output, representing in this example audio signaling, at output 217. Other types of digital data can be so processed. The described digital to analog converter 215 in one example comprises a Class B style single ended output digital to analog converter. The apparatus 200 further includes a current to voltage converter 220, which may be a speaker or headphone amplifier, including a resistor 225 and an amplifier 230. The amplifier 230 in this example includes at least a first input 233 configured to receive the single ended analog output from output 217 and a second input 237 connected to a common mode voltage (Vcm). The resistor 225 is connected between the first input 233 of the amplifier 230 and an output 239 of the amplifier 230. The output 239 is configured to connect to a load, for example, a speaker or headphone. So configured, the apparatus 200 can provide an audio signal through a modulator and digital to analog converter to a load such as the headphone speaker without including a separate current to voltage converter, instead using the headphone amplifier as the current to voltage converter.

Figure 3:
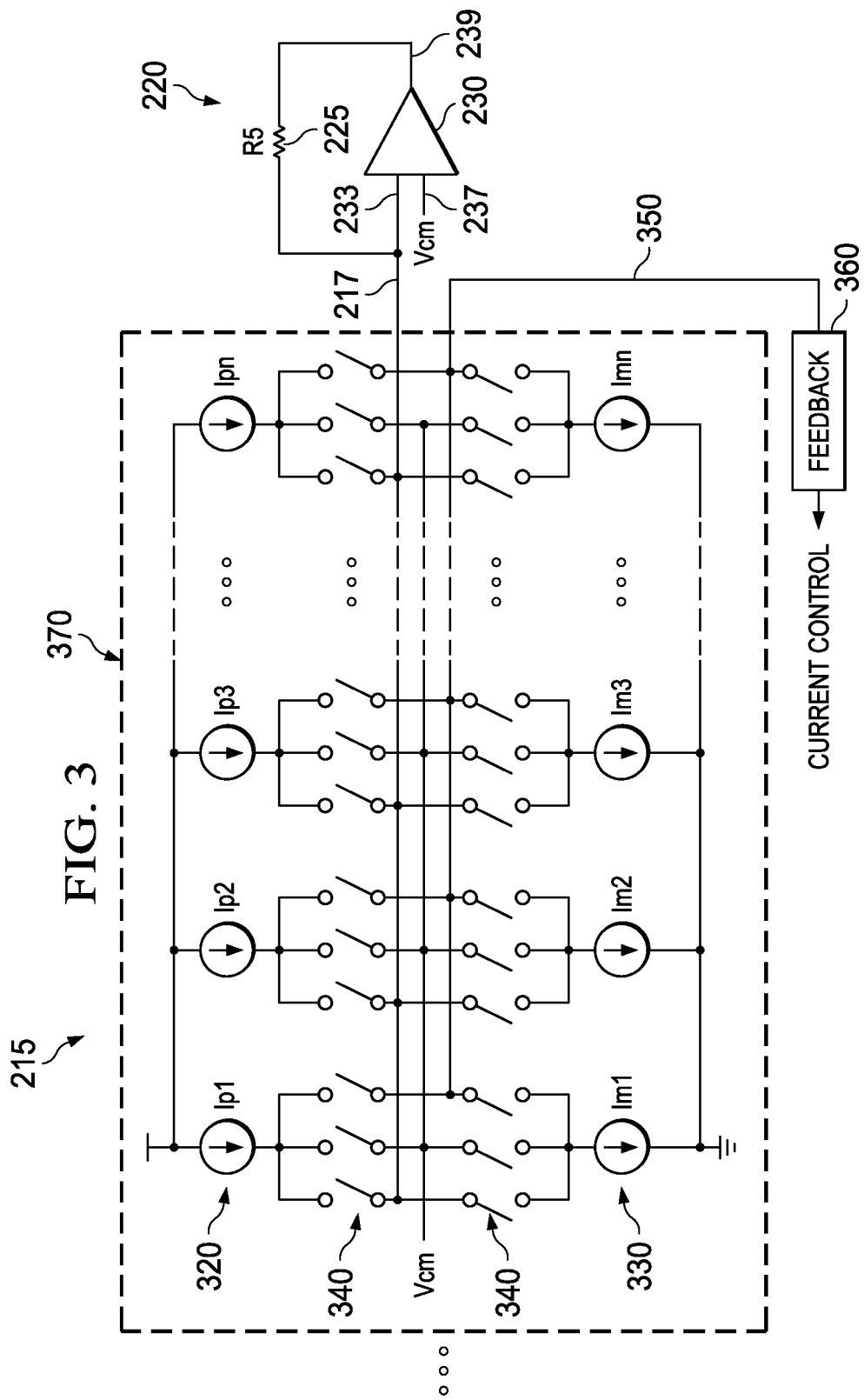
FIG. 3 comprises a circuit diagram of an example digital to analog converter with an amplifier and feedback circuit as configured in accordance with various embodiments of the invention.

With reference to FIG. 3, an example approach to the digital to analog converter 215 will be described. In this example, the digital to analog converter 215 includes a plurality of positive current sources 320 and a plurality of negative current sources 330. The individual current sources 320 and 330 of this example feed into one of three paths through switches 340. The three paths include the single ended analog output 217, the common mode voltage (Vcm), and a path 350 to a feedback circuit 360. In this example, the digital to analog converter 215 is a "2N-1" level digital to analog converter implemented using current sources in sync. In this example, the modulator 205 is a delta sigma modulator that also provides a "2N-1" level output. In other words, the outputs from the modulator 205 are N-1, N-2, ..., 1, 0, -1, -2, ..., -N+2, and -N+1. The output of the digital to analog converter 215 is single ended so that it can be fed directly to the headphone amplifier 220. More specifically, in the example of FIG. 3, the digital to analog converter has N positive current sources (Ip1 through Ipn) and N negative current sources (Im1 through Imn). The current sources are individually connected to the amplifier 230 depending on the output of the modulator 205. Table 1 below summarizes the connection of the current sources 320 and 330 to the amplifier 230 in the example of FIG. 3.

TABLE 1

| Serial No. | Modulator Output | Number of Positive Current Sources Connected to the Amplifier A2 | Number of Negative Current Sources Connected to the Amplifier A2 |
|---|---|---|---|
| 1 | N - 1 | N - 1 | 0 |
| 2 | N - 2 | N - 2 | 0 |
| ... | ... | ... | ... |
| N - 1 | 1 | 1 | 0 |
| N | 0 | 0 | 0 |
| N + 1 | -1 | 0 | 1 |
| ... | ... | ... | ... |
| 2N - 2 | -N + 2 | 0 | N - 2 |
| 2N - 1 | -N + 1 | 0 | N - 1 |

The table shows the number of and type of current sources connecting to the amplifier 230 as decided by the modulator output. In other words, the digital to analog converter 215 is configured to connect the individual current sources 320 and 330 to the amplifier 230 based upon the single ended digital output from the modulator 205. Per Table 1 above, zero current sources connect to the amplifier when the modulator 205 output is 0, and the number of sources connected to the amplifier 230 increases when signal strength increases. The type of current source connected to the amplifier 230, positive or negative, is determined in response to the signal polarity. Such an arrangement is common with Class B type digital to analog converters. In one approach, the digital to analog converter 215 comprises an analog finite impulse response (FIR) filter including a plurality of cells 370. Individual cells 370 each have a plurality of positive current sources 320 and a plurality of negative current sources 330. Individual ones of current sources 320 and 330 feed into one of three paths through the switches 340 as described above. In the example of FIG. 3, an individual cell 370 is illustrated where multiple individual cells are contemplated to be included in the circuit structure with their combined output being provided to the single ended output 217 to the amplifier 230. When not connected to the amplifier 230, individual current sources 320 or 330 are connected to either the common mode voltage Vcm or to the feedback circuit 360.

An example feedback circuit 360 will be described with reference to FIG. 4 and FIG. 5. The feedback circuit 360 includes an integrator circuit 410 including a summing amplifier 413 and an integrating capacitor 417 connected together receive an error signal. The error signal includes current from individual ones of the positive current sources 320 and negative current sources 330 connected to the path 350 to the feedback circuit 360. The feedback circuit 360 of this example further includes switches 420 with gates 430 connected to a node 440 electrically connecting an output 415 of the summing amplifier 413 and a compensation capacitor 450. The compensation capacitor 450 is connected between the output 415 of the summing amplifier 413 and a node 460 between the integrating capacitor 417 and a resistor 470. The switches 420 of the feedback circuit 360 individually correspond to the individual cells 370 of the digital to analog converter 215, and the switches 420 are individually configured to route current to the individual cells 370 to control positive and negative currents to effect current value matching for the individual cells 370.

In the example where the digital to analog converter 215 implements an analog FIR filter by having multiple cells 370, each of which having multiple positive current sources 320 and negative current sources 330. This implementation of the filter allows the digital to analog converter 215 to reduce out of band noise for the analog output signal. The positive current sources 320 and negative current sources 330, however, can have the mismatch between them. The current mismatch can cause harmonics to appear in the output of the digital analog converter thereby degrading the audio quality of the ultimate output of the circuit. For example, positive current sources 320 may be implemented using PMOS transistors whereas negative current sources 330 can be implemented using the NMOS transistors. Thus, because the positive current sources 320 and negative current sources 330 are using different types of devices, a mismatch in the individual current output of the individual sources can occur.

Figure 4:
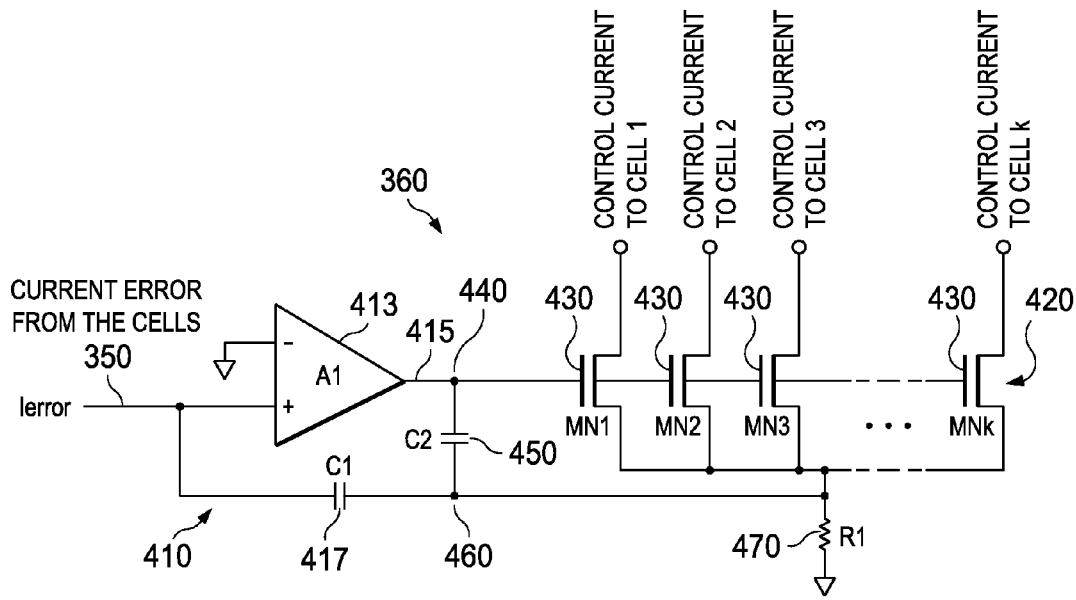
FIG. 4 comprises an example feedback circuit as configured in accordance with various embodiments of the invention.

Implementation of the example feedback circuit of FIG. 4, however, can correct this current mismatch. In one approach, the positive and negative current sources that are connected to the feedback circuit 360 are rotated over time. The feedback structure integrates this mismatch signal that is manifested in an error signal provided on the path 350. In response, the switches 420 provide a control circuit signal in the form of a current that is routed back to individual cells 370 of the digital to analog converter 215. An example of such a structure is shown in FIG. 5.

Figure 5:
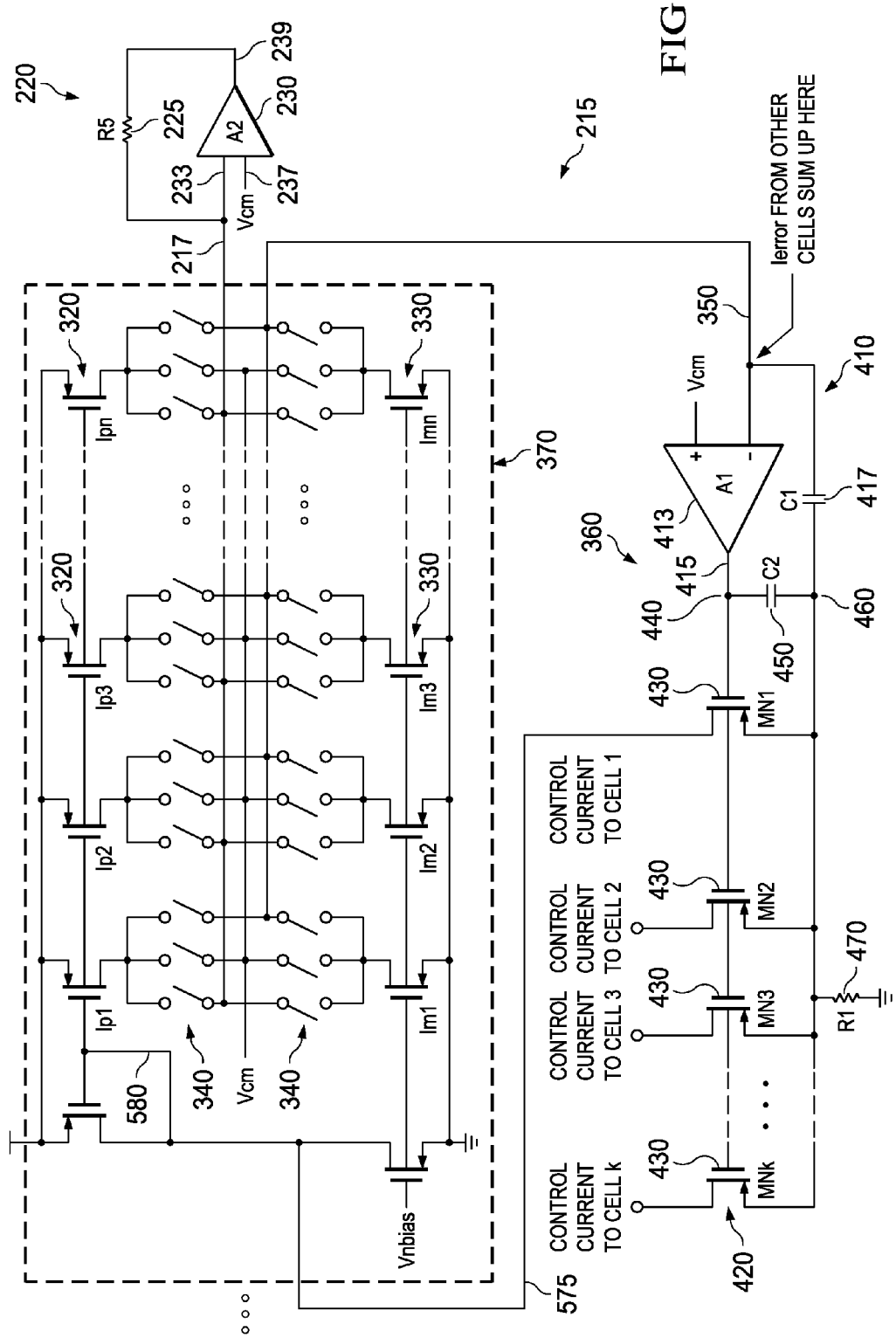
FIG. 5 comprises a circuit diagram showing one cell of an example digital to analog converter connected to an amplifier into one representation of a feedback circuit as configured in accordance with various embodiments of the invention.

In FIG. 5, the output from an individual switch 420 of the feedback circuit 360 is connected via an electronic path 575 back to the individual cell 370 of the digital to analog converter 215. This path 575 provides the feedback signal to the controls for the individual current sources 320 and 330, thereby effecting a correction of the mismatch between the positive current sources 320 and the negative current sources 330. A control for matching the positive and negative sources can be done in one of three ways. First, the control can be done such that there is a control of all the positive current sources 320 provided together to a given cell 370, which is known in the art as gang control of the current sources 320. Second, control of all the negative sources 330 of a given cell 370 can be ganged together. Third, there can be individual control of both types of current sources, the positive current sources 320 and the negative current sources 330. The example of FIG. 5 illustrates gang control of the positive current sources 320 through connection of the feedback path 575 to a link 580 to the controls for the positive current sources 320 of cell 370. The current provided from the feedback circuit 360, therefore, is used to control the positive current sources 320 to help correct the current mismatch with the negative current sources 330. Implementation of control of the negative current sources 330 or of simultaneous feedback control of both types of current sources can be implemented by one of skill in the art using similar approaches.

Figure 6:
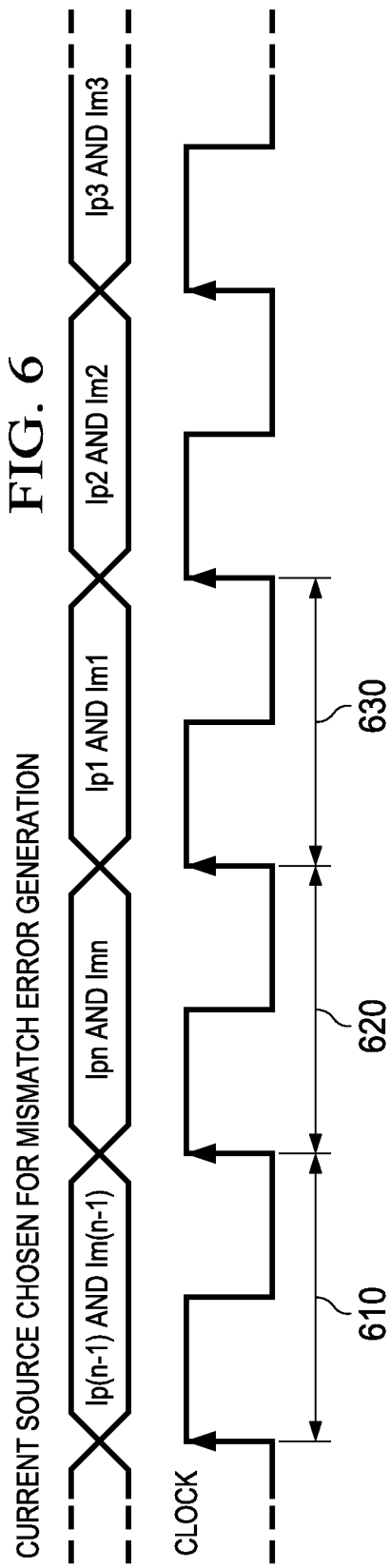
FIG. 6 comprises a representation of an example of cycling of current sources being connected to the feedback circuit with respect to the clock cycle of the circuit as configured in accordance with various embodiments of the invention.

An example approach to connecting positive and negative current sources from the digital to analog converter 215 to the feedback circuit 360 will be discussed with respect to FIG. 6. In this approach, individual cells 370 are configured to rotate connection of individual positive current sources 320 together with individual negative current sources 330 to the path 350 to the feedback circuit 360. For example, current sources Ip(n−1) and Im(n−1) are connected to the path 350 to the feedback circuit 360 for one clock cycle 610 of the circuit. This connection is effected through the switches 340, which are controlled by a separate controller (not shown) controlling the operation of the circuit. The effect of the connection is to have a positive current source's signals and its corresponding negative current source's signals add together on the path 350 to the integrator circuit 410, such that the mismatching current between the individual positive current source and the corresponding individual negative current source is detected for this single clock cycle 610. On the next clock cycle 620, a second pair of a positive current source Ipn and a corresponding negative current source Imn is connected to feed into the path 350 to the feedback circuit 360. Again, this connection of a pair of current sources, one positive current source Ipn and one negative current source Imn, is connected to the path 350 to the feedback circuit 360 for one clock cycle 620. At the start of the next clock cycle 630, another different pair of current sources, one positive Ip1 and one negative Im1, is connected to the path 350 to the feedback circuit 360. Although the integrating of the error signals is described as happening over a single clock cycle for the circuit, other time periods or methods can used for sensing the error signal and providing the feedback control to the individual cells.

So configured, the chosen positive and negative current sources are rotated every cycle such that the integrator circuit sees the average error over time. Based on this average error, a feedback correction current is provided from the individual switch 420 that corresponds to the cell 370 corresponding to the sensed current sources along the feedback path 575 as described above. So configured, the digital to analog converter 215 can be controlled to manage errors introduced by mismatches of the positive current sources 320 and the negative current sources 330 and still provide a low noise and low power single ended output through output 217 to the amplifier 230.

Figure 7:
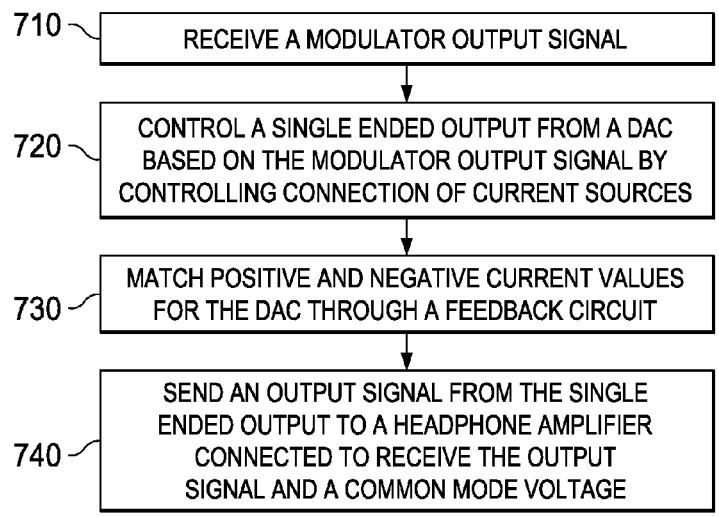
FIG. 7 comprises a flow diagram of an example method of operation of a circuit as configured in accordance with various embodiments of the invention.

With reference to FIG. 7, an example method of operation of the circuit such as that described above will be described. The method includes receiving 710 the modulator output signal at a digital to analog converter. In one example, the receiving includes receiving the modulator output signal at a current steering digital to analog converter. The method further includes controlling 720 a single ended output from the digital to analog converter based on the modulator output signal. The controlling 720 includes controlling connection of current sources of the digital to analog converter to the single ended output based on the modulator output signal received at the digital to analog converter. In one example, this controlling includes connecting an increasing number of current sources to the single ended output in response to receiving increasing signal strength of the modulator output signal. The type of current source connected to the single ended output is determined in response to the polarity of the modulator output signal. Such an approach can be effected through the use of a Class B digital to analog converter. In yet another example, the method may further include implementing an analog finite impulse response filter in the digital to analog converter.

Referring again to FIG. 7, the illustrated method includes matching 730 positive and negative current values for the digital to analog converter through a feedback circuit electrically connected to the digital to analog converter. The method further includes at 740 sending an output signal from the single ended output to a headphone amplifier connected to receive the output signal and a common mode voltage. The matching positive and negative current values through the feedback circuit may in one approach include integrating current sources from the digital to analog converter and providing a current control signal to individual cells of the digital to analog converter. So configured, a circuit implementing this method can provide a single ended output to an amplifier to eliminate the noise introduced by a separate current voltage converter that is typically implemented in audio circuits of this kind. Accordingly, noise is reduced, and an improved dynamic range can be realized in the audio output through the method executed by such a circuit.

A more specific example of a circuit embodying the teachings as described herein will be described with reference to FIGS. 2 and 5. In this example, a sigma delta modulator 205 is configured to receive an UP-sampled audio signal from an UP-sampler circuit 210 and to output a modulated digital signal. A current steering digital to analog converter 215 is configured to receive the modulated digital signal from the sigma delta modulator 205 and provide a single-ended analog output 217. The current steering digital to analog converter 215 includes at least a plurality of cells 370 configured to allow the current steering digital to analog converter 215 to operate as an analog finite impulse response filter. Individual cells 370 of the plurality of cells 370 include at least a series of positive current sources 320 and a series of negative current sources 330. The current steering digital to analog converter 215 also includes switches 340 configured to connect the positive current sources 320 and the negative current sources 330 individually to one of the group including single-ended analog output 217, a common mode voltage (Vcm), and a path 350 to a feedback circuit 360. The switches 340 are configured to connect a positive current source 320 and a corresponding negative current source 330 for a given cell 370 to the path 350 to the feedback circuit 360 for a clock cycle for the apparatus 200 and to connect a different positive current source and a corresponding negative current source for the given cell 370 to the path 350 to the feedback circuit 360 for a next cycle for the apparatus 200. The connection of current sources to the path to the feedback circuit for a single cycle is further illustrated in the example of FIG. 6 and described above.

The feedback circuit 360 of this example includes at least an integrator circuit 410 including a summing amplifier 430 and an integrating capacitor 417 connected to together to receive an error signal including current from individual ones of the positive current sources 320 and the negative current sources 330 connected to the path 350 to the feedback 360. The feedback circuit 360 further includes feedback switches 420 with gates 430 connected to a node 440 connecting an output 415 of the summing amplifier 413 and a compensation capacitor 450. The compensation capacitor 450 is connected between the output 415 of the summing amplifier 413 and a node 460 between the integrating capacitor 417 and a resistor 470. In one example, the resistor 470 has a value of 100 kilo ohms, the integrating capacitor 417 has a capacitance of 10 pico farads, and the compensation capacitor has a capacitance of 1 pico farad, although other values of course may be used in other applications. The switches 420 individually correspond to the individual cells 370 and are individually configured to route current to the individual cells 370 to control positive and negative currents to effect current value matching for the individual cells 370.

The single-ended analog output 217 is configured to feed to a headphone amplifier 220, which is configured to receive the single-ended analog output 217 and the common mode voltage (Vcm). In this example, the headphone amplifier includes the resistor 225 and an amplifier 230. The amplifier 230 includes at least a first input 233 configured to receive a single-ended amplifier output 217 and a second input 237 connected to the common mode voltage (Vcm). The resistor 225 is connected between the first input 233 of the amplifier 230 and an output 239 of the amplifier 230, which is configured to connect to a load. The load typically is a speaker or a headphone speaker. In this example, the headphone amplifier 220 is configured to act as a current voltage converter between the current steering digital to analog converter 215 and the load.

So configured, the digital to analog converter is designed to reduce noise in the audio signal provided to a speaker. Moreover, in various examples, a differential signal chain implemented in the digital to analog converter provides an output directly to the headphone amplifier, which itself acts as a current to voltage converter. Accordingly, a separate current to voltage converter circuit is not needed, thereby eliminating a potential source of noise in the system. The dynamic range of such an arrangement increases the volume in the digital and reduces the gain in the analog for lower input signals. This is done dynamically but does not provide any dynamic change to the signal and therefore introduces limited audio artifacts for the listener. Accordingly, the circuit arrangement described above can provide a low power, high dynamic range digital to analog conversion, for example, in a headphone application, which is common for portable consumer music devices such as MP3 players and the like.

Those skilled in the art will recognize that a wide variety of modifications, alterations and combinations can be made with respect to the above described embodiments without departing from the scope of the invention. Such modifications, alterations and combinations to be viewed as being within the ambient concept.

What is claimed is:

1. An apparatus comprising:
   a modulator configured to receive an input signal and to output a digital signal that is a modulated form of the input signal;
   a digital to analog converter configured to receive the digital signal and provide a single ended analog output; and
   a current-to-voltage converter comprising a resistor and an amplifier;
   wherein the amplifier includes at least:
      a first input connected to receive the single ended analog output, and
      a second input connected to a common mode voltage; and
   wherein the resistor is connected between the first input of the amplifier and an output of the amplifier, which is configured to connect to a load.

2. The apparatus of claim 1 wherein the digital to analog converter comprises a plurality of positive current sources and a plurality of negative current sources wherein individual current sources feed into one of three paths through switches, the three paths including the single ended analog output, the common mode voltage, and a path to a feedback circuit.

3. The apparatus of claim 1 wherein the digital to analog converter comprises an analog FIR filter including a plurality cells, individual cells having a plurality of positive current sources and a plurality of negative current sources, wherein individual current sources feed into one of three paths through switches, the three paths including the single ended analog output, the common mode voltage, and a path to a feedback circuit.

4. The apparatus of claim 3 further comprising the feedback circuit, which comprises an integrator circuit including a summing amplifier and an integrating capacitor connected to together receive an error signal including current from individual ones of the positive current sources and the negative current sources connected to the path to the feedback circuit.

5. The apparatus of claim 4, wherein the feedback circuit further comprises switches with gates connected to a node connecting an output of the summing amplifier and a compensation capacitor, the compensation capacitor connected between the output of the summing amplifier and a node between the integrating capacitor and a resistor, wherein the switches individually correspond to the individual cells and are individually configured to route current to the individual cells to control positive and negative currents to effect current value matching for the individual cells.

6. The apparatus of claim 3 wherein the individual cells are configured to rotate connection of individual positive current sources together with individual negative current sources to the path to the feedback circuit.

7. The apparatus of claim 1 wherein the digital to analog converter comprises a class-B style single ended output digital to analog converter.

8. The apparatus of claim 2 wherein the digital to analog converter is configured to connect the current sources to the amplifier based upon the single ended digital output from the modulator.

9. A method comprising:
   receiving a modulator output signal at a digital to analog converter;
   controlling a single ended output from the digital to analog converter based on the modulator output signal, the controlling comprising controlling connection of current sources to the single ended output based on the modulator output signal;

matching positive and negative current values for the digital to analog converter through a feedback circuit electrically connected to the digital to analog converter; and sending an output signal from the single ended output to a headphone amplifier connected to receive the output signal and a common mode voltage.

10. The method of claim 9 wherein the receiving the modulator output signal comprises receiving the modulator output signal at a current steering digital to analog converter.

11. The method of claim 9 wherein the controlling connection of current sources to the single ended output based on the modulator output signal comprises connecting an increasing number of current sources to the single ended output in response to receiving an increasing signal strength of the modulator output signal with a type of current source connected to the single ended output determined in response to polarity of the modulator output signal.

12. The method of claim 9 further comprising implementing an analog finite impulse response filter in the digital to analog converter.

13. The method of claim 9 wherein the matching positive and negative current values for the digital to analog converter through the feedback circuit comprises integrating current sources from the digital to analog converter and providing a current control signal to individual cells of the digital to analog converter.

14. An apparatus comprising:
   a sigma delta modulator configured to receive an up-sampled audio signal and to output a modulated digital signal;
   a current steering digital to analog converter configured to receive the modulated digital signal and provide a single ended analog output, the current steering digital to analog converter including at least:
      a plurality of cells configured to allow the current steering digital to analog converter to operate as an analog finite impulse response filter, individual cells of the plurality of cells including at least a series of positive current sources and a series of negative current sources, and
      switches configured to connect the positive current sources and the negative current sources individually to one of a group including the single ended analog output, a common mode voltage, and a path to a feedback circuit,
      wherein the switches are configured to connect a positive current source and a corresponding negative current source for a given cell to the path to the feedback circuit for a cycle for the apparatus and to connect a different positive current source and corresponding negative current source for the given cell to the path to the feedback circuit for a next cycle for the apparatus; and
   the feedback circuit, which includes at least:
      an integrator circuit including a summing amplifier and an integrating capacitor connected to together receive an error signal including current from individual ones of the positive current sources and the negative current sources connected to the path to the feedback circuit,
      feedback switches with gates connected to a node connecting an output of the summing amplifier and a compensation capacitor, the compensation capacitor connected between the output of the summing amplifier and a node between the integrating capacitor and a resistor, wherein the switches individually correspond to the individual cells and are individually configured to route current to the individual cells to control positive and negative currents to effect current value matching for the individual cells;
   wherein the single ended analog output is configured to feed to a headphone amplifier configured to receive the singled ended analog output and the common mode voltage.

15. The apparatus of claim 14 wherein the headphone amplifier comprises a resistor and an amplifier;
   wherein the amplifier includes at least:
      a first input connected to receive the single ended analog output, and
      a second input connected to the common mode voltage;
   wherein the resistor is connected between the first input of the amplifier and an output of the amplifier, which is configured to connect to a load, and
   wherein the headphone amplifier is configured to act as a current to voltage converter between the current steering digital to analog converter and the load.

* * * * *